(12) United States Patent
Huang et al.

(10) Patent No.: US 8,604,541 B2
(45) Date of Patent: Dec. 10, 2013

(54) STRUCTURE AND FABRICATION PROCESS OF SUPER JUNCTION MOSFET

(75) Inventors: Qin Huang, Wuxi (CN); Yuming Bai, Wuxi (CN); Yang Gao, Wuxi (CN)

(73) Assignee: Wuxi Versine Semiconductor Corp. Ltd., Wuxi, Jiangsu Province (CN)

( * ) Notice: Subject to any disclaimer, the term of this patent is extended or adjusted under 35 U.S.C. 154(b) by 18 days.

(21) Appl. No.: 13/441,101

(22) Filed: Apr. 6, 2012

(65) Prior Publication Data
US 2012/0256254 A1 Oct. 11, 2012

(30) Foreign Application Priority Data
Apr. 8, 2011 (CN) .......................... 2011 1 0089219

(51) Int. Cl.
*H01L 29/78* (2006.01)

(52) U.S. Cl.
USPC ............ 257/329; 257/E29.256; 257/E29.262; 257/E21.4; 257/E21.418; 438/268

(58) Field of Classification Search
USPC .................. 257/329, 378, E29.256, E29.262, 257/E21.41, E21.418; 438/268
See application file for complete search history.

(56) References Cited

U.S. PATENT DOCUMENTS

| | | | |
|---|---|---|---|
| 6,545,316 B1* | 4/2003 | Baliga ........................... | 257/329 |
| 2007/0069324 A1* | 3/2007 | Takaishi ........................ | 257/493 |
| 2007/0080399 A1* | 4/2007 | Takaishi ........................ | 257/341 |
| 2009/0050959 A1* | 2/2009 | Madson ........................ | 257/332 |
| 2009/0218618 A1* | 9/2009 | Blank et al. ................... | 257/331 |
| 2011/0133272 A1* | 6/2011 | Mauder et al. ................. | 257/335 |

* cited by examiner

*Primary Examiner* — Allan R Wilson
(74) *Attorney, Agent, or Firm* — Jacobson Holman PLLC; Jiwen Chen

(57) ABSTRACT

This invention discloses a specific superjunction MOSFET structure and its fabrication process. Such structure includes: a drain, a substrate, an EPI, a source, a side-wall isolation structure, a gate, a gate isolation layer and source. There is an isolation layer inside the active area underneath the source. Along the side-wall of this isolation layer, a buffer layer with same doping type as body can be introduced & source can be extended down too to form field plate. Such buffer layer & field plate can make the EPI doping much higher than convention device which results in lower Rdson, better performance, shorter gate so that to reduce both gate charge Qg and gate-to-drain charge Qgd. The process to make such structure is simpler and more cost effective.

22 Claims, 9 Drawing Sheets

STRUCTURE AND FABRICATION PROCESS OF SUPER JUNCTION MOSFET

The present application claims the priority of Chinese Application No. 201110089219.X filed Apr. 8, 2011, under 35 U.S.C. §119, which is hereby incorporated by reference.

TECHNICAL FIELD

The present invention discloses a structure and fabrication process for a super junction metal-oxide-semiconductor field-effect transistor (MOSFET), especially a MOSFET and an insulated gate bipolar transistor (IGBT) which belongs to the field of semiconductor device and its fabrication.

BACKGROUND OF THE INVENTION

VDMOS (vertical diffused power MOSFET) and IGBT are two most commonly used power transistors nowadays. IGBT is composed of BJT (bipolar junction transistor) and MOS, which has the advantage of high input impedance of MOSFET and low conduction voltage drop of BJT. It is a very suitable candidate to be used in areas such as AC electric motor, frequency converter, power switch, lighting circuit, traction and driving. VDMOS is a voltage control device. Under the proper control of the gate voltage, the surface of the semiconductor is inversed and forms a conduction path. VDMOS combines the advantages of BJT and conventional MOS. Compared to BJT, it switches faster and has less switching loss. Its input impedance is high and driving power is small. It has good frequency characteristics and high linear transconductance. It should be particularly pointed out that it has a negative temperature coefficient and does not have the second-breakdown problem of BJT. It also has a larger safe operating area. Therefore, VDMOS is an ideal power device in both switching and linear applications. VDMOS has been used in different area such as motor frequency adjustment, inverter, UPS, switching power supply, electric switch, automotive electronics and electrical ballast.

Usually, VDMOS uses a traditional integrated gate area. In conduction mode, a channel is only formed at two sides of the gate area. There is a large overlap between the silicon gate and the drain electrode, namely the corresponding non-channel areas of the silicon gate and drain electrode are larger. Thus, such structure has higher Qgd. The manufacture of this traditional structure is rather complex. Six (6) or seven (7) steps of masking are needed for the whole process. Therefore, the production cost is relatively higher.

In order to improve the device performance and simplify the fabrication cost, a new planar super junction MOSFET structure is proposed.

CONTENT OF THE INVENTION

This invention provides a new super junction MOSFET structure and fabrication process.

In order to solve the technical problems described above, the invention uses the following technical schemes:

A type of super power transistor structure, which comprises:
a drain electrode;
a first conductive substrate, which is above the drain;
an active source area above the first conductive substrate; the active source area from bottom to top, includes the first conductive drift area, a first conductive source area located above one side of the first conductive drift area, and a second conductive body between the first conductive source area and the first conductive drift area;
a side-wall isolation structure located above the first conductive substrate, contacts with the active source area at the side that is close to the first conductive source area; the height of such isolation structure is lower than the height of said active source area such that the side-wall of the first conductive source area and the second conductive body area are not blocked by the side-wall isolation structure;
a gate area above the second conductive body area in the active source area;
a surface isolation structure located above the gate and covering the surface of the first conductive source area and the first conductive drift area;
a source electrode covering the surface of the surface isolation structure, and extending above the side wall isolation structure from the side close to the first conductive source area, at the same time, conduct with the first conductive source area and the second conductive body area;

The gate area includes both gate dielectric and gate above the dielectric. Preferably, there is an isolation layer above the gate.

As a preferred embodiment, the source electrode also includes a board formed by the downward extension of the side wall of the side wall isolation structure.

As a preferred embodiment, there is a second conductive buffer area in the active source area. Such buffer layer is under the second conductive body area, and it contacts with the second conductive body, the side-wall isolation structure and the first conductive drift area, respectively. Further, the second conductive buffer area is the $2^{nd}$ type lightly doped semiconductor material and the second conductive body is the second type heavily doped semiconductor material.

Another type of super junction MOSFET structure includes:
a collector;
the second conductive substrate being above the collector;
an active area is above the substrate; from bottom to top, it includes the first conductive drift area, the first conductive emitter above the first conductive drift area, and the second conductive body area located between the first conductive emitter and first conductive drift area;
the side-wall isolation structure being above the first conductive substrate and contacts with the side of the source area close to the first conductive emitter. The height of such isolation structure is lower than the height of said active area such that the side-wall of the first conductive emitter and the second conductive body area is not blocked by the side wall isolation structure;
a gate is above the second conductive body area in the active source area.
a surface isolation structure covers the gate surface, and it covers upper surfaces of the first conductive emitter area and the first conductive drift area.
an emitter covers the surface isolation structure and it extends downward into the side wall isolation structure from the side of the first conductive emitter area that is close to the active source area, at the same time, the emitter electronically conductive with the first conductive emitter area and the second conductive body area.

The gate area includes both a gate dielectric layer and a gate electrode above the gate dielectric layer. There is also an isolation layer above the gate area.

As a preferred embodiment, there is a second conductive buffer layer in the active source area. Such buffer layer is under the conductive body area, and it contacts with the second conductive body area, the side-wall isolation structure and the first conductive drift area. Further, the second conductive buffer layer is the second conductive lightly doped semiconductor material and the second conductive body is the second heavily doped semiconductor material.

A fabrication process of super junction MOSFET includes the following steps:
i) forming a first conductive epitaxial layer on the semiconductor substrate, and forming a gate area on the epitaxial layer;
ii) forming a surface isolation area around the gate area to cover both the gate and upper surface of the epitaxial layer around the gate;
iii) forming heavily doped first and second conductive areas inside the epitaxial layer on one side of the surface isolation area such that both first and second conductive areas extend below the surface isolation area; the second conductive area is positioned below the first conductive area and isolates the first conductive area from the rest of the epitaxial layer;
iv) Using self aligned technology along the surface isolation structure downward to etch off a part of the first conductive area and a part of the second conductive area which are not covered by the surface isolation structure, and forming a trench in the epitaxial layer;
v) Applying heat treatment diffusion method to enlarge the first and second conductive areas such that the second conductive area is extended below the gate;
vi) Filling the trench with dielectric material and removing the extra dielectric material on an upper part of the trench through etchback technique to expose the side-wall of the first and second conductive areas. The remaining dielectric material forms the side-wall isolation structure;
vii) Making the upper electrode to make it cover the surface of the surface isolation structure, and extend into the side wall isolation structure from the trench downward. It also contacts the side walls of the first and second conducive areas;
viii) Making the lower electrode underneath the semiconductor substrate.

When making such MOSFET, the semiconductor substrate in step i) is the first conductive type substrate. When making the IGBT, the semiconductor substrate in step i) is the second conductive type substrate.

The gate unit includes both a gate dielectric layer and a gate layer above it. There is also an isolation layer above the gate layer.

As a preferred embodiment, when making the electrode, step vii) includes the field plate part of the upper electrode which is formed by the continuous extension downward of the side-wall isolation structure.

Another fabrication process of a super junction MOSFET includes the following steps:
i) forming an epitaxial layer of the first conductive type on the semiconductor substrate, and making a gate area on the epitaxial layer;
ii) making the surface isolation area around the gate area to cover both the surface of the gate area and upper surface of partial epitaxial layer around the gate area;
iii) formation of heavily doped first and second conductive areas inside the epitaxial layer on one side of the surface isolation structure such that both the first and second conducive areas internally extend below the surface isolation structure area and the second conductive area being below the first conductive are and separates the first conductive area from the rest of the epitaxial layer;
iv) using self alignment technology to etch off the partial first conductive area and partial second conductive area that are not blocked by the surface isolation structure along the edges of the surface isolation structure downward, and form a trench in the epitaxial layer;
v) applying the tilt ion implantation method to form the second conductive lightly doped buffer layer underneath the second conductive area from the side wall of the trench;
vi) applying heat treatment diffusion method to enlarge the first conductive area, the second conductive area and the second conductive buffer area such that the second conductive area extends underneath the gate;
vii) using self alignment technology to etch off the excessive heavily doped second conductive material formed at the bottom of the trench due to the tilt ion implantation specified in step v) along the edge of the surface isolation structure downward;
viii) filling dielectric materials in the trench, and using etch-back techniques to erase the excessive dielectric material to expose the side-wall of both the first and second conductive areas. The remaining dielectric in the trench forms the side-wall isolation structure;
ix) making the upper electrode so that it covers the surface of the surface isolation structure, and extends downwards into the side wall structure from the trench, and contacts the side walls of the first conductive and second conductive areas;
x) making the lower electrode underneath the semiconductive substrate.

When making such MOSFET, the semiconductive substrate in step i) is the first conductive substrate. When making IGBT, the semiconductive substrate in step i) is the second conductive substrate.

The gate unit includes both a gate dielectric layer and a gate electrode layer above it. Preferably, there is also an insulation layer above the gate.

As a preferred embodiment, step ix) includes the field plate of the upper electrode formed by the continuous downward extension of the isolation side-wall.

As a preferred embodiment, step viii) includes the surface isolation layer profile optimization by isotropic etch before trench refilling.

The advantages of this invention are:

A vertical structure was used in the super junction MOSFET. A side-wall isolation structure was introduced underneath the source (or emitter) electrode. The same type of buffer area as the body area can be installed below the body area. The source electrode can also be extended downward at the external side of the side wall isolation structure to form a field plate. Due to the introduction of such buffer area and the field plate, the doping concentration in the drifting area can be much higher to effectively reduce the drain to source resistance Rdson and improve the FOM. Compared to conventional VDMOS which forms trenches at two sides of the integral gates, the actual gate coverage area can be made much smaller according to this invention. Thus the gate charge Qg can be reduced by reducing the gate coverage area. In addition, the actual comparative area of the gate and the electrode (drain electrode) below the substrate is smaller in comparison with the conventional VDMOS, which effectively reduces the gate drain charge Qgd. Furthermore, this invention has simpler fabrication process. The self alignment technology was used. Masks are only used for gate contact formation. Therefore, only three mask layers are needed for the whole process which is very cost effective.

BRIEF DESCRIPTIONS OF THE DRAWINGS

IMPLEMENTATION EXAMPLES

A few examples will be presented below to illustrate this invention. The figures are not in scale for simplicity.

Example 1

Figure 1:
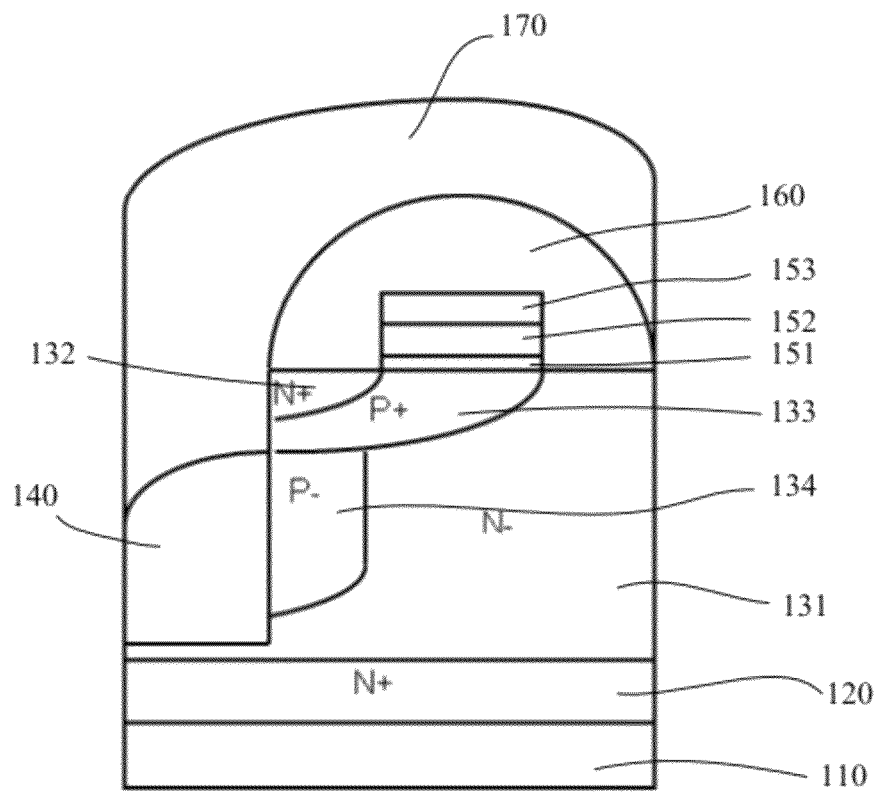
FIG. 1 shows method 1—structure schematic of the super junction MOSFET.

This example shows a MOSFET structure illustrated in FIG. 1. This device includes: a drain 110, the first conductive substrate 120, an active area, a side-wall isolation structure 140, a gate, a surface isolation structure 160 and a source 170.

The first conductive substrate 120 is above the drain 100. The active area is above the first conductive substrate 120. The active area includes the first conductive drift region 131, the first conductive source 132 above the first conductive drift region 131 and the first conductive source 132 and the second conductive body 133 between the first conductive source 132 and the first conductive drift region 131; the side-wall isolation structure 140 is above the first conductive substrate 120 and it contacts to the side-wall of said active area which is close to the first conductive source 132. The height of the side-wall isolation structure is lower than the active area such that the side-wall of the first conductive source 132 and the second conductive body 133 is not covered by the side-wall isolation structure 140. The gate is above the second conductive body 133. It includes a gate dielectric material 151 and a gate layer 152 above 151. There is an isolation layer 153 above the gate 152; the surface isolation structure 160 covers the surface of the gate 150 as well as the top portion of the first conductive active area 132 and the first conductive drift region 131. The source 170 covers the surface of the surface isolation structure 160 and it extends along the first conductive source 132 and extends on to the side-wall isolation structure 140. It also contacts with the first conductive source 132 and the second conductive body 132.

The second conductive buffer layer 134 is inside the active area. The second conductive buffer layer 134 is underneath the second conductive body. It contacts with the second conductive body 133, the side-wall isolation structure 140 and the first conductive drift region 131. The second conductive buffer layer 134 is a lightly doped second conductive semiconductor material. The second conductive body is a heavily doped second conductive semiconductor material.

As an example, in NMOS, the first conductive substrate 120 uses N+ substrate. The first conductive drift region 131 can be N− type but with higher doping concentration comparing to conventional N− EPI. The first conductive source 132 can be N+ and the second conductive body 133 can be P+. the second conductive buffer layer 134 can be P−. In general, dielectric 151 can be SiO2, SION or high k material. Gate 152 can be conventional poly Si or Ti, Ni, Tungsten, tantalum, tantalum nitride, tungsten nitride, TiN, TiSi, Tungsten Si or Nickel Si.

Such MOSFET uses vertical structure with side-wall isolation structure underneath the active area. The doping concentration in the drift area can be much higher due to the p− buffer layer so that to reduce the drain to source on resistance. It also has a shorter gate than conventional VDMOS which results in smaller gate charge Qg and gate-to-drain charge Qgd.

The device performance parameter FOM is correlated to gate charge, gate-to-drain charge Qgd and drain-to-source on resistance by:

$$FOM1 = Rdson*Qg$$

$$FOM2 = Rdson*Qgd$$

It shows that a better FOM of the device implemented in Example 1 can be achieved by reducing the drain to source on-resistance Rdson, gate charge Qg and gate-to-drain charge Qgd.

Figure 2A:
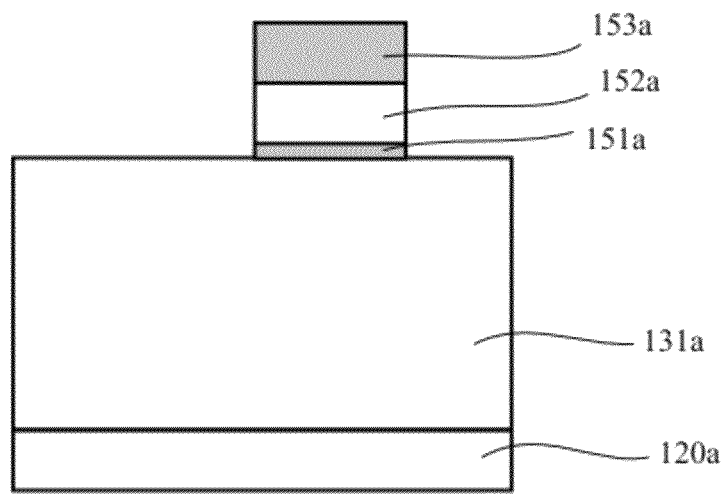
FIGS. 2a-2k shows method 1—key process flow of the super junction MOSFET.

According to 2a-2k, the fabrication process for the above device includes:

1. As shown in FIG. 2a, the first conductive epitaxial layer (EPI) (N− EPI) is grown on the first conductive substrate 120a (N+ type semiconductor substrate). The EPI doing concentration can be high to form heavily doped drift region to reduce the drain to source on resistance Rdson. Then gate is formed above the EPI 131a which includes a gate dielectric 151a, a gate 152a above the gate dielectric 151a as well as the isolation layer 153a which is above gate 152a.

Figure 2B:
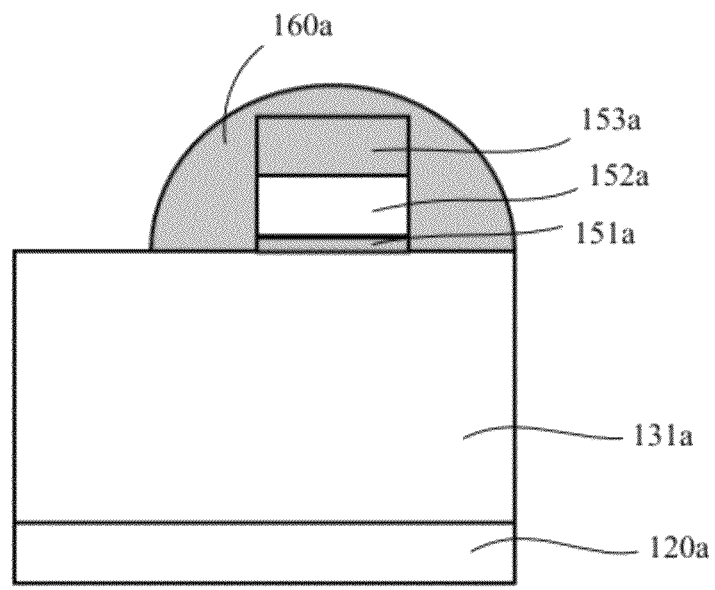

2. As shown in FIG. 2b, the surface isolation layer is formed around the gate to cover the gate surface and the top surface of the surrounding EPI around the gate.

Figure 2C:
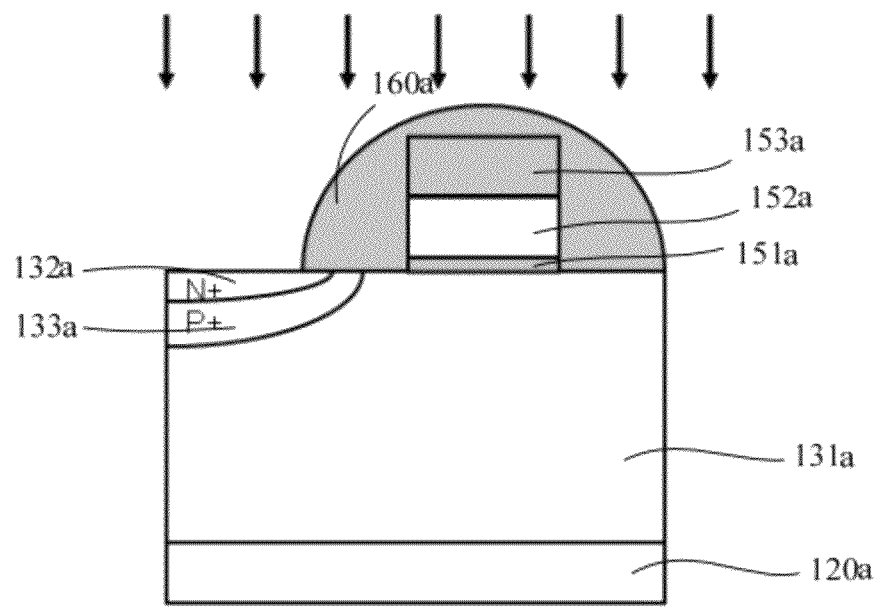

3. As shown in FIG. 2c, though P and N ion implantation, a heavily doped first conductive area 132 & second conductive area 133a are formed in the EPI 131a which is on one side of surface isolation structure 160a. The first conductive area 132a & the second conductive area 133a both extend underneath the surface isolation structure 160a. the second conductive area 133a is underneath the first conductive area 132a and it isolates the first conductive area 132a and the remaining EPI 131a.

Figure 2D:
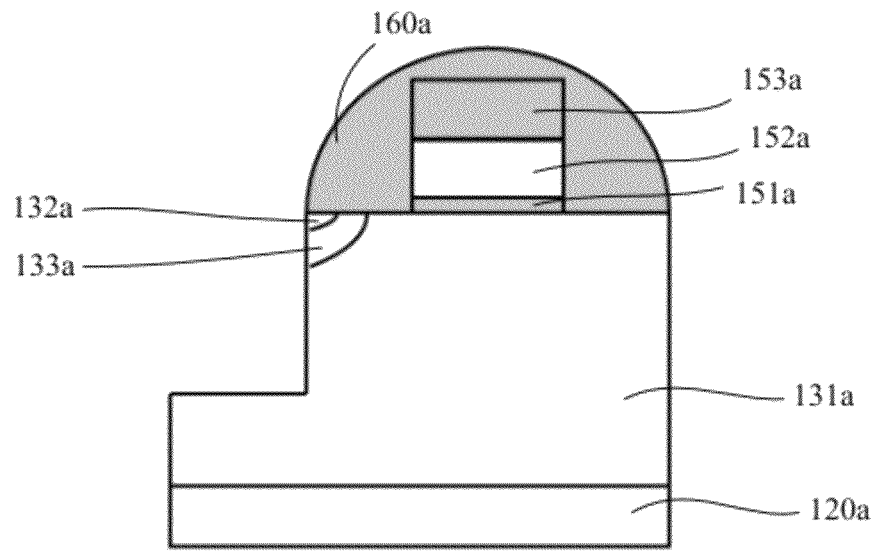

4. As shown in FIG. 2d, self aligned etching along the surface isolation area 160a was used to etch the uncovered first conductive area 132a and partial second conductive area 133a and thus form the trench inside EPI 131a.

Figure 2E:
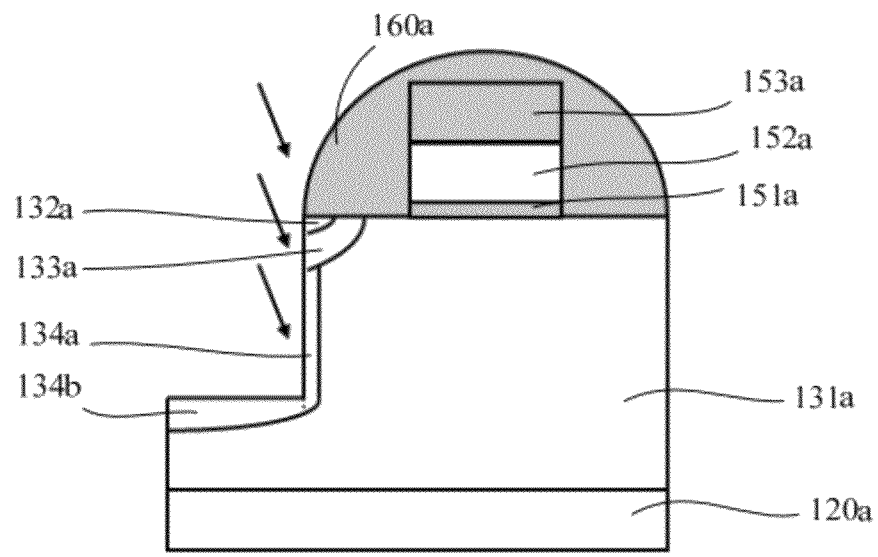

5. As shown in FIG. 2e, ion tilt implantation was used along the said trench side-wall to form the second conductive buffer layer 134a underneath the second conductive area 133. Due the tilt angle implantation, an excessive $2^{nd}$ type heavily doped area 134b was formed at the trench bottom.

Figure 2F:
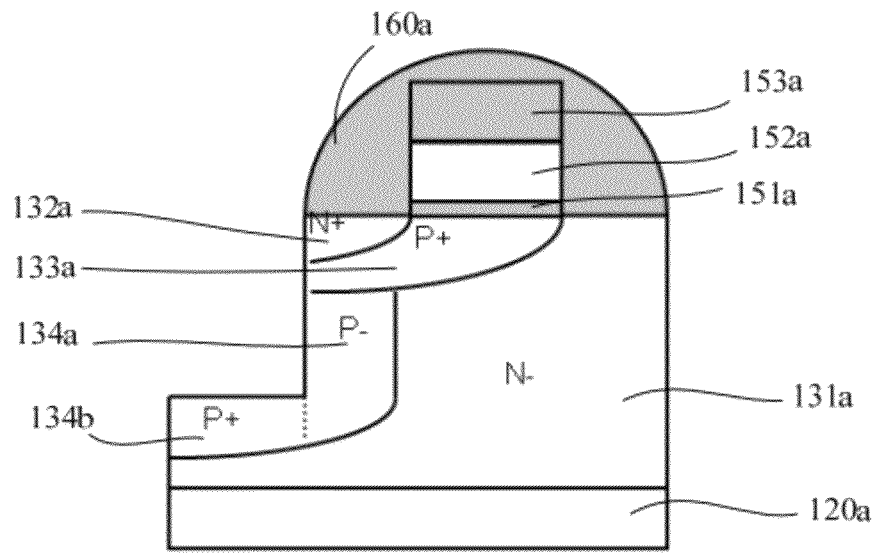

6. Thermal drive was used to drive the first conductive area 132a, the second conductive area 133a and the second conductive buffer layer 134a such that the second conductive area 133a extended underneath the gate, as shown in FIG. 2f.

Figure 2G:
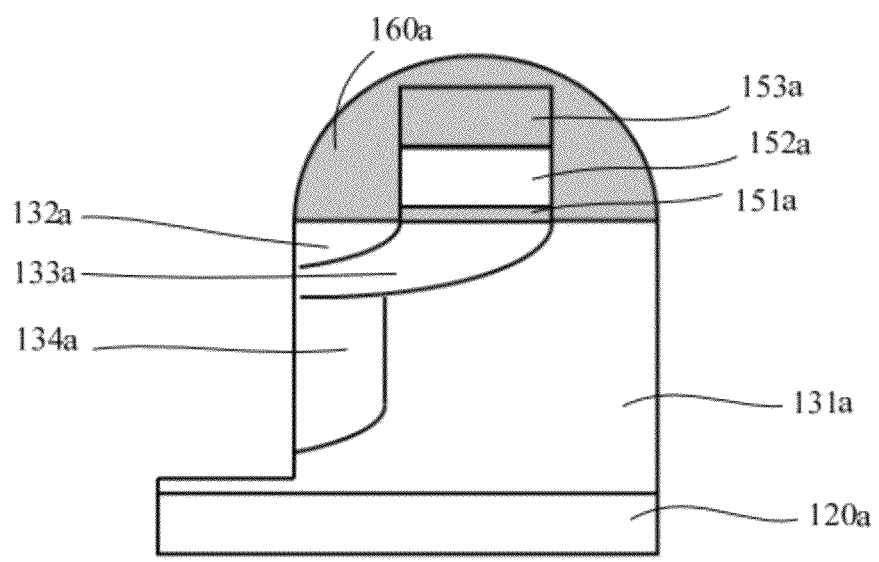

7. As shown in FIG. 2g, the excessive $2^{nd}$ type heavily doped area 134b from tilt implantation from step 5 was etched away by self aligned etch process.

Figure 2H:
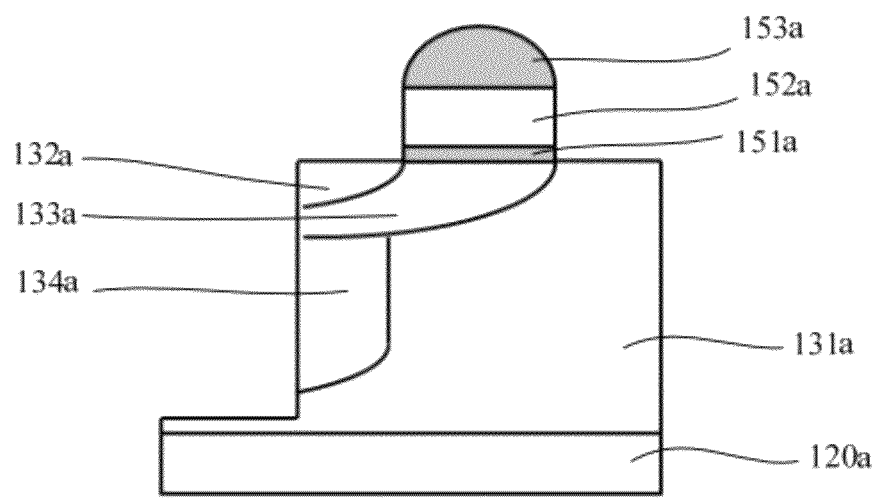
Figure 2I:
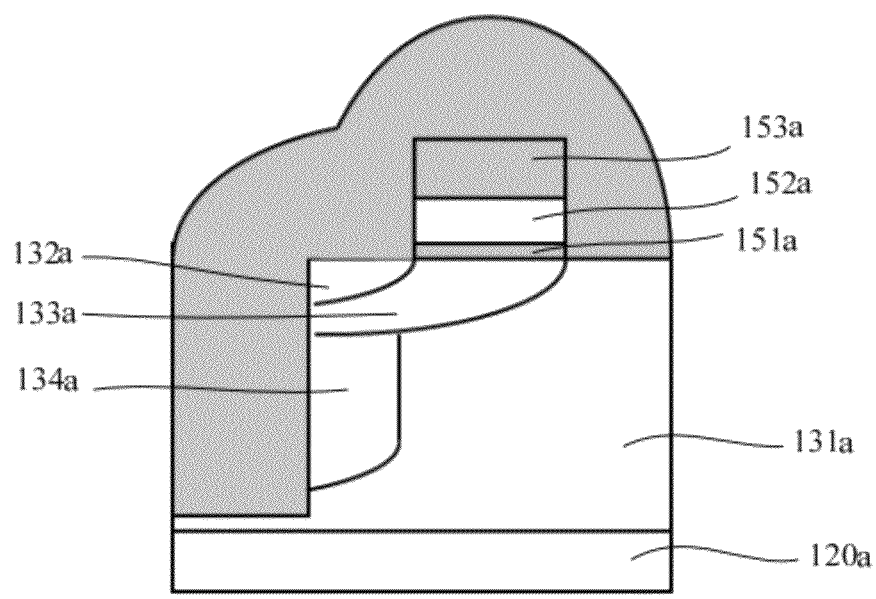
Figure 2J:
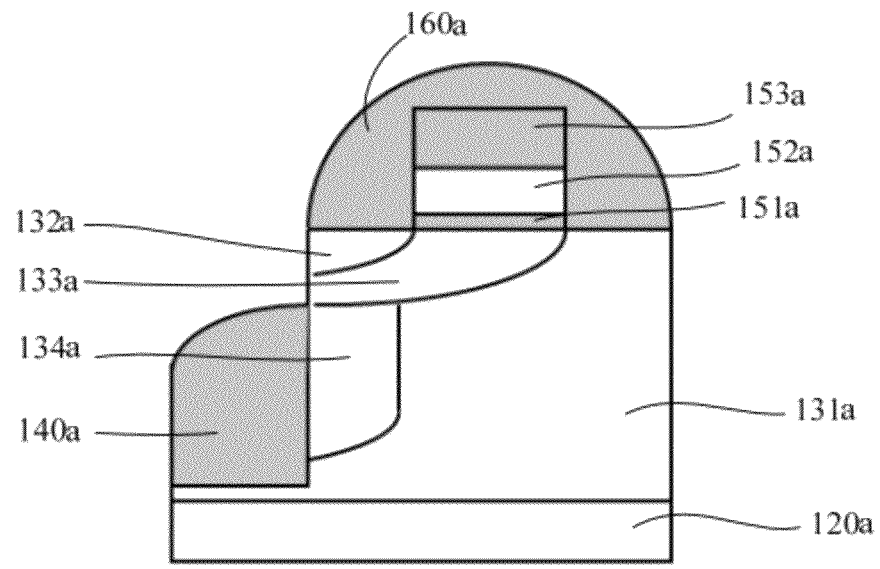

8. As shown in FIG. 2h, isotropic etching was used to smooth the surface isolation area 160a. Then the trench was filled with dielectric material and etched back the top portion dielectric material to expose side wall of the first conductive area 132a and the second conductive area 133a, as illustrated in FIG. 2i. The remaining dielectric material in the trench forms the side-wall isolation structure 140a, as shown in FIG. 2j.

Figure 2K:
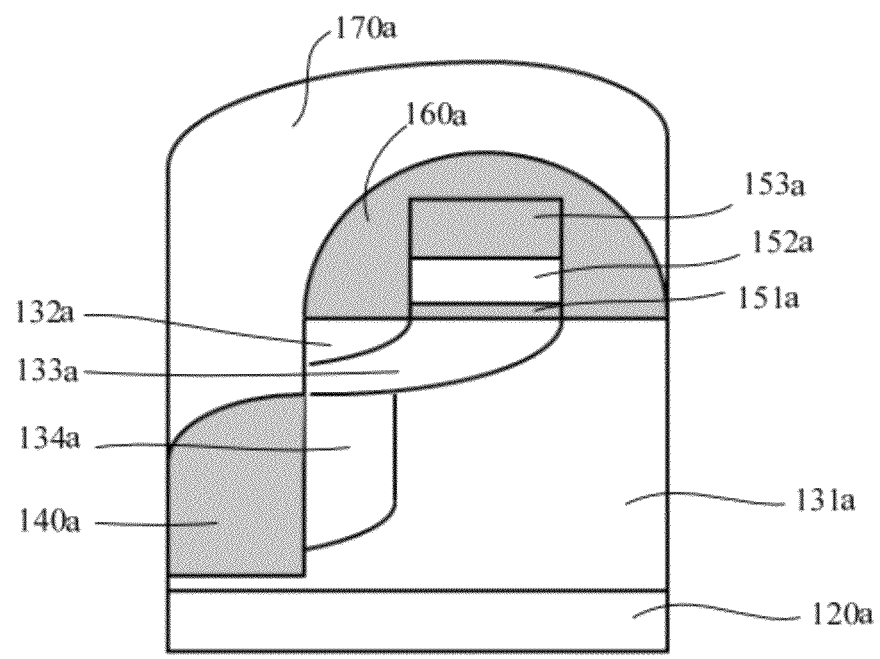

9. As shown in FIG. 2k, a source was formed to cover the surface isolation structure 160a and it extended into the side wall isolation structure 140a and contacted the side-wall of the first conductive area 132a and second conductive area 133a.
10. A drain was formed underneath the first conductive substrate 120a.

This process used self aligned etch process and it is relatively simple. Masks were required only at gate and source formation. Three masks are required for the whole process which is very cost effective.

Example 2

Figure 3:
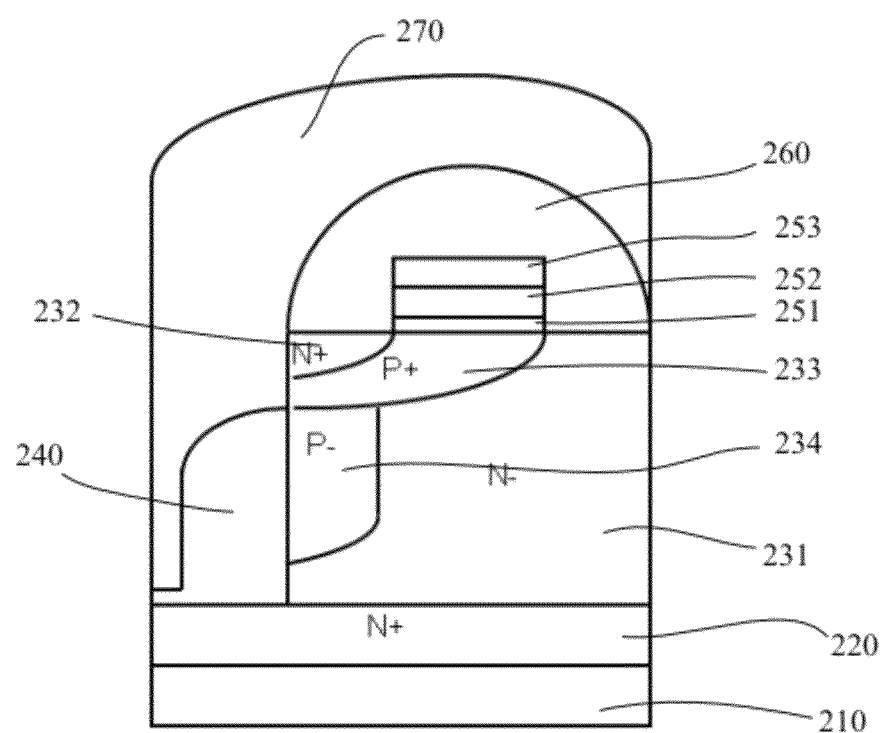
FIG. 3 shows method 2—structure schematic of the super junction MOSFET.

This example presents another super junction MOSFET device structure. As illustrated in FIG. 3, such device structure includes: a drain 210, the first conductive substrate 220, an active area, a side wall isolation structure 240, a gate, a surface isolation structure 260 and a source 270.

From bottom to top, the active area includes the first conductive drift region 231, the first conductive source 232 above 231, and the second conductive body between the first conductive source 232 and first conductive drift region 231. Inside the active area there is a second conductive buffer layer 234 which is underneath the second conductive body 233. It contacts with the second conductive body area 233, the side wall isolation structure 240 and the first conductive drift area 231. The second conductive buffer layer 234 is a second type lightly doped semiconductor material while the second conductive body 233 is a second type heavily doped semiconductor material. The gate includes a gate dielectric layer 251 and a gate electrode 252 above it. There is an isolation layer 253 above the gate electrode 252.

The difference from Example 1 is that the source 270 includes the extended field plate along one side of the side wall isolation structure 240.

Example 3

Figure 4:
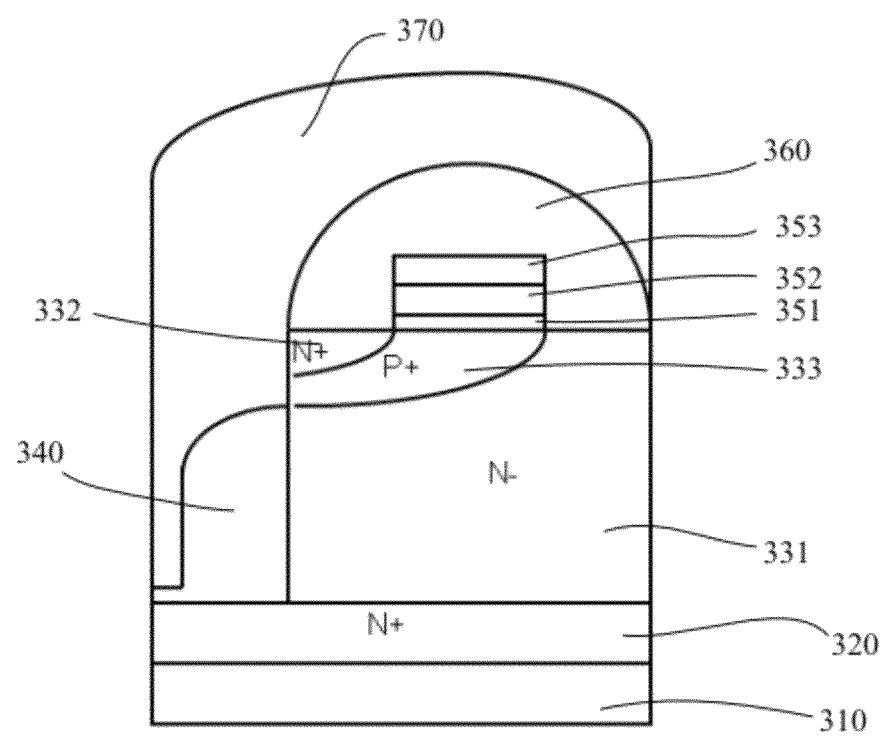
FIG. 4 shows method 3—structure schematic of the super junction MOSFET.

This example presents another super junction power MOSFET device structure. As illustrated in FIG. 4, such structure includes: a drain 310, the first conductive substrate 320, an active area, a side wall isolation structure 340, a gate, a surface isolation structure 360 and a source 370.

From bottom to top, the active area includes the first conductive drift region 331, the first conductive source 332 above 331 and the second conductive body 333 between the first conductive source 332 & first conductive drift area 331. The gate includes a gate dielectric 351 layer and a gate electrode 352 above it. There is an isolation layer 353 above the gate electrode 352. The source 370 includes the extended field plate along one side of the side wall isolation structure 340.

The difference from Example 2 is that such structure has no second conductive buffer layer. With the source field plate, the EPI doping can be higher even without the second conductive buffer layer so that to reduce the drain to source on resistance Rdson and improve the device performance.

The implementation method is slightly different from Example 2. It includes the following steps:
1. The first conductive EPI is grown on the first conductive. Then gate is formed above the EPI.
2. Surface isolation layer is formed around the gate to cover the gate surface and the top surface of the surrounding EPI around the gate 3. Heavily doped first conductive and second conductive areas are formed in the EPI, which is on one side of the surface isolation structure. The first conductive area and the second conductive area both extend underneath the surface isolation structure. The second conductive area is underneath the first conductive area and it isolates the first conductive area and the remaining EPI.
4. Self aligned etching along the surface isolation area was used to etch the uncovered first conductive area & partial second conductive area and thus form the trench inside EPI.
5. Thermal drive was used to drive the first and second conductive areas such that the second conductive area is extended underneath the gate.
6. Trench refilling by dielectric material. The excessive dielectric material was etched away to expose the side wall of the first and second conductive areas. The remaining dielectric material inside the trench formed the side wall isolation structure.
7. A source was formed to cover the surface isolation structure and it extended into the side wall isolation structure and contacted the side-wall of the first and second conductive areas. And it extended along the side wall of the side-wall isolation structure to form the source field plate.
8. A drain was formed underneath the first conductive substrate.

No figure illustration is made due to the similarity between this method and Example 1.

Example 4

Figure 5:
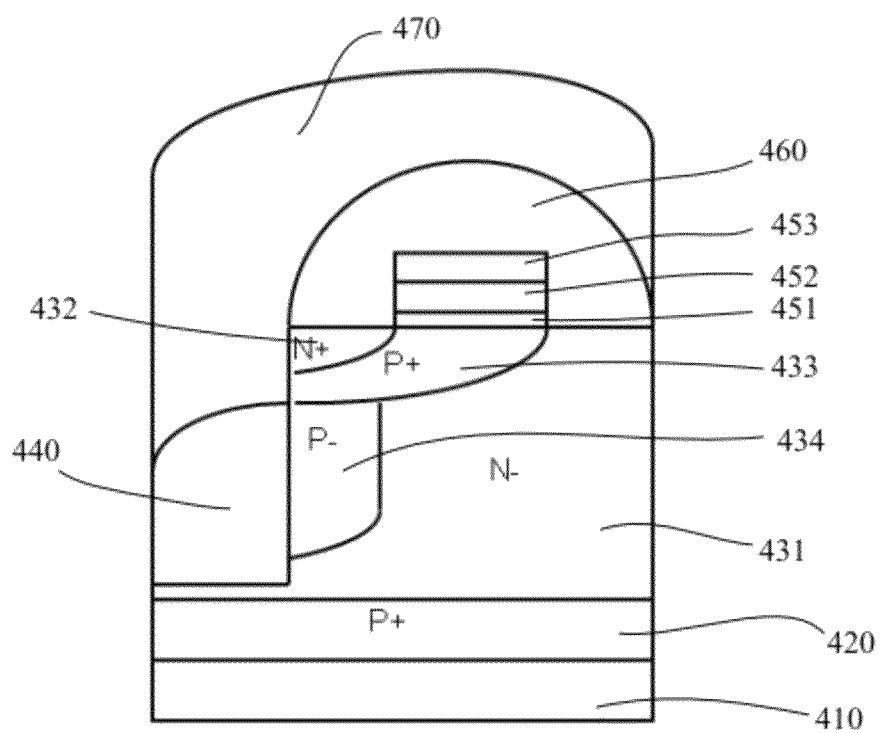
FIG. 5 shows method 4—structure schematic of the IGBT.

This example presents a super junction IGBT device structure. As shown in FIG. 5, such device structure includes: a collector 410, the second conductive substrate 420, an active area, a side-wall isolation structure 440, a gate, a surface isolation structure 460 and an emitter 470.

From bottom to top, the active area includes the first conductive drift area 431, the first conductive emitter 432 which is above the first conductive drift area 431, the second conductive body 433 between the first conductive emitter 432 and the first conductive drift area 431. In the active area there is a second conductive buffer layer 434 which is underneath the second conductive body 433. It contacts the second conductive body 433, the side-wall isolation structure 440 and the first conductive drift region 431. The second conductive buffer layer 434 is the second type lightly doped semiconductor material; the second conductive body area 433 is the second type heavily doped semiconductor material. The gate includes a gate dielectric 451 and a gate electrode 452 above it. There is an isolation layer 435 above the gate electrode 452.

The fabrication process is similar to the one in Example 1. The differences are the substrate: in MOSFET, first conductive substrate was used while in IGBT, the second conductive substrate was used.

Since other techniques related to this invention are well known in this field so no more explanation are present here. The above examples are only used to explain but not confine the techniques of this invention. Any techniques which are correlated to the main ideals should be considered with the scope of this invention.

The invention claimed is:
1. A super junction metal-oxide-semiconductor field-effect transistor (MOSFET) comprising:
a drain;
a first conductive substrate above the drain;
a source area above the first conductive substrate, from bottom to top, the source area including a first conduc- tive drift area, a first conductive source area above the first conductive drift area, and a second conductive body area between the first conductive source area and the first conductive drift area;

a side-wall isolation structure being above the first conductive substrate and contacting with one side of the source area that is close to the first conductive source area, height of such isolation structure being lower than thickness of said source area such that the side-wall of the first conductive source and the second conductive body being not blocked by the side-wall isolation structure;

a gate being above the second conductive body area of the source area;

a surface isolation structure being above the gate and covering upper surfaces of the first conductive source area and the first conductive drift area;

a source electrode covering the surface isolation structure and it extending downward from one side of the source area that is close to the first conductive source area to reach above the side-wall isolation structure, and conductive with the first conductive source area and the second conductive body area.

2. The MOSFET of claim 1, characterized in that: the gate area includes a gate isolation layer and a gate electrode layer above the gate isolation layer.

3. The MOSFET of claim 1, characterized in that: there is another isolation layer above the gate electrode layer.

4. The MOSFET of claim 1, characterized in that: the source area includes a field plate formed by an extension of a side wall of the side wall isolation structure.

5. The MOSFET of claim 1, characterized in that: the source area includes the second conductive buffer layer which is located underneath the second conductive body area, contacts with the second conductive body area, the side-wall isolation structure and the first conductive drift area.

6. The MOSFET of claim 5, characterized in that: the second conductive buffer layer is a lightly doped semiconductor material, said second conductive body is a heavily doped semiconductor material.

7. A fabrication process of super junction MOSFET of claim 1 comprising the following steps:
   i) forming an epitaxial layer (EPI) above a semiconductor substrate and forming a gate area on the epitaxial layer;
   ii) forming a surface isolation area around the gate area to cover both the gate area and partial upper surface of periphery of the gate area;
   iii) forming a heavily doped first and second conductive areas inside the EPI on one side of the surface isolation area such that both the first and second conductive areas extend below the said surface isolation area and the second conductive area isolates the first conductive area from the rest of the EPI;
   iv) using self aligned technology to etch along the surface isolation structure downward to etch off a part of the first conductive area and a part of the second conductive area which are not covered by the surface isolation structure, and forming a trench in the epitaxial layer;
   v) applying heat treatment diffusion method to enlarge the first and second conductive areas such that the second conductive area is extended below the gate;
   vi) filling dielectric materials in the trench, and using etch-back techniques to erase the excessive dielectric material to expose the side-wall of both the first and second conductive areas, remaining dielectric in the trench forms the side-wall isolation structure;
   vii) making an upper electrode to make it cover the surface of the surface isolation structure, extend into the side wall isolation structure from the trench downward, and contact the side walls of the first and second conducive areas; and
   viii) making the lower electrode underneath the semiconductor substrate.

8. The process according to claim 7, characterized in that the substrate specified in step i) is the first conductive substrate.

9. The process according to claim 7, characterized in that the substrate specified in step i) is the second conductive substrate.

10. The process according to claim 7, characterized in that the gate unit includes a gate dielectric layer and a gate layer above the gate dielectric layer as well as a nonconductive layer above the gate layer.

11. The process according to claim 7, characterized in that, the source formation specified in step vii) includes a field plate of the upper electrode formed by downward extension of side wall of the side-wall isolation structure.

12. A super junction metal-oxide-semiconductor field-effect transistor (MOSFET) comprising:
    a drain;
    a second conductive substrate above the drain;
    a source area above the second conductive substrate, from bottom to top, the sources including a first conductive drift area, a first conductive emitting area above one side of the first conductive drift area, and the second conductive area between the first conductive emitting area and the first conductive drift area;
    a side-wall isolation structure being above the second conductive substrate and contacting with one side of the source area that is close to the first conductive source area, height of such isolation structure being lower than thickness of said source area such that the side-wall of the first conductive emitting area and the second conductive body being not blocked by the side-wall isolation structure;
    a gate being above the second conductive body area of the source area;
    a surface isolation structure being above the gate and covering upper surfaces of the first conductive source area and the first conductive drift area;
    a source electrode covering the surface isolation structure and it extending downward from one side of the source area that is close to the first conductive emitting area to reach in the side-wall isolation structure, and being conductive with the first conductive emitting area and the second conductive body area.

13. The MOSFET of claim 12, characterized in that: the gate area includes a gate isolation layer and a gate electrode layer above the gate isolation layer.

14. The MOSFET of claim 13, characterized in that: there is another isolation layer above the gate electrode layer.

15. The MOSFET of claim 12, characterized in that: the source area includes a second conductive buffer layer which is located underneath the second conductive body area, and contacts with the second conductive body area, the side-wall isolation structure and the first conductive drift area.

16. The MOSFET of claim 15, characterized in that: the second conductive buffer layer is a lightly doped semiconductor material, and said second conductive body is a heavily doped semiconductor material.

17. A fabrication process of super junction MOSFET of claim 12 comprising the following steps:
    i) forming a first conductive epitaxial layer on a semiconductor substrate and forming a gate area on the epitaxial layer;

ii) forming a surface isolation structure around the gate area to cover both the gate area and a part of upper surface of the epitaxial around the gate area;

iii) forming of heavily doped first and second conductive areas inside the epitaxial layer on one side of the surface isolation area such that both the first and second conductive areas extend below the surface isolation structure, the second conductive area being the first conductive area and separating the first conductive area with the rest of the epitaxial layer;

iv) using self aligned technology to etch along the surface isolation structure downward to etch off a part of the first conductive area and a part of the second conductive area which are not covered by the surface isolation structure, and forming a trench in the epitaxial layer;

v) applying the tilt ion implantation method to form a second conductive lightly doped buffer layer underneath the second conductive area from the side wall of the trench;

vi) applying heat treatment diffusion method to enlarge the first and second conductive areas such that the second conductive area is extended below the gate vii) using self alignment technology to etch off the excessive heavily doped second conductive material formed at the bottom of the trench due to the tilt ion implantation specified in step v) along the edge of the surface isolation structure downward;

viii) filling the trench with dielectric material and removing the extra dielectric material on upper part of the trench through etchback technique to expose the side-wall of the first and second conductive areas, the remaining dielectric material forming the side-wall isolation structure;

ix) making an upper electrode to make it cover the surface of the surface isolation structure, extend into the side wall isolation structure from the trench downward, and contact the side walls of the first and second conducive areas; and x) making a lower electrode underneath the semiconductor substrate.

18. The fabrication process according to claim 17, characterized in that the substrate specified in step i) is the first conductive substrate.

19. The fabrication process according to claim 17, characterized in that the substrate specified in step i) is the second conductive substrate.

20. The fabrication process according to claim 17, characterized in that the gate unit includes a gate dielectric layer and a gate electrode layer above the gate dielectric layer, a non-conductive layer being above the gate electrode layer.

21. The fabrication process according to claim 17, characterized in that the upper electrode formation specified in step ix) includes forming a field plate part of the upper electrode by continuous extension downward of the side-wall isolation structure.

22. The fabrication process according to claim 17, characterized in that, prior to filing the trench in step viii), using isotropic etching to trim the surface isolation structure.

* * * * *